United States Patent
Smith et al.

(10) Patent No.: US 8,426,263 B2
(45) Date of Patent: Apr. 23, 2013

(54) PATTERNING A GATE STACK OF A NON-VOLATILE MEMORY (NVM) WITH FORMATION OF A METAL-OXIDE-SEMICONDUCTOR FIELD EFFECT TRANSISTOR (MOSFET)

(75) Inventors: Bradley P. Smith, Austin, TX (US); James W. Miller, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 196 days.

(21) Appl. No.: 13/077,569

(22) Filed: Mar. 31, 2011

(65) Prior Publication Data
US 2012/0252179 A1    Oct. 4, 2012

(51) Int. Cl.
*H01L 21/8238* (2006.01)

(52) U.S. Cl.
USPC ............ 438/201; 438/257; 257/E21.179; 257/E21.422; 257/E21.68

(58) Field of Classification Search ............ 438/201, 438/211, 257, 258, 275, 569, 585, 593; 257/E21.179, E21.422, E21.68
See application file for complete search history.

(56) References Cited

U.S. PATENT DOCUMENTS

| | | | |
|---|---|---|---|
| 6,424,568 B2 | 7/2002 | Ahn | |
| 6,664,168 B1 | 12/2003 | Andideh et al. | |
| 6,716,694 B2 | 4/2004 | Yamada | |
| 6,898,069 B2 | 5/2005 | Yamaguchi et al. | |
| 7,560,763 B2 | 7/2009 | Ikegami | |
| 2004/0072397 A1 * | 4/2004 | Lowe et al. | 438/200 |
| 2005/0093050 A1 | 5/2005 | Rost et al. | |
| 2006/0024893 A1 | 2/2006 | Min et al. | |
| 2006/0292815 A1 | 12/2006 | Roberts et al. | |

FOREIGN PATENT DOCUMENTS

| | | |
|---|---|---|
| WO | 2006023026 A2 | 3/2006 |
| WO | 2007001783 A2 | 4/2007 |
| WO | 2009120407 A2 | 10/2009 |

OTHER PUBLICATIONS

Richier et al.; "Investigation on Different ESD Protection Strategies Devoted to 3.3 V RF Applications (2Ghz) in a 0.18um CMOS Process"; EOS/ESD Symposium; Sep. 2000; pp. 3A.2.1-3A.2.9; IEEE.
Salman et al.: "SOI Lateral Diode Optimization for ESD Protection in 130nm and 90nm Technologies";EOS/ESD Symposium; Sep. 2005; 7 Pages; IEEE.
Voldman et al.: "Electrostatic Discharge Protection in Silicon-on-Insulator Technology"; IEEE International SOI Conference; Oct. 1999; pp. 68-71; IEEE.

* cited by examiner

*Primary Examiner* — Thanhha Pham
(74) *Attorney, Agent, or Firm* — Joanna G. Chiu; James L. Clingan, Jr.

(57) ABSTRACT

A first dielectric layer is formed on a substrate in a transistor region and an NVM region, a first conductive layer is formed on the first dielectric layer, a second dielectric layer is formed on the first conductive layer, and a second conductive layer is formed over the second dielectric layer. A patterned etch is performed to remove at least a portion of the second conductive layer in the transistor region and to expose an extension portion of the first conductive layer. A first mask is formed over the transistor region having a first pattern, wherein the first pattern is of a gate stack of the MOSFET and an extension in the extension portion extending from the gate stack, and a second mask over the NVM region having a second pattern, wherein the second pattern is of a gate stack of the NVM cell. A patterned etch is then performed.

20 Claims, 6 Drawing Sheets

PATTERNING A GATE STACK OF A NON-VOLATILE MEMORY (NVM) WITH FORMATION OF A METAL-OXIDE-SEMICONDUCTOR FIELD EFFECT TRANSISTOR (MOSFET)

CROSS-REFERENCE TO RELATED APPLICATIONS

This application is related to U.S. patent application Ser. No. 13/077,581, filed on even date, entitled "PATTERNING A GATE STACK OF A NON-VOLATILE MEMORY (NVM) WITH FORMATION OF A GATE EDGE DIODE," naming Bradley P. Smith as inventor, and assigned to the current assignee hereof, and to U.S. patent application Ser. No. 13/077,563, filed on even date, entitled "PATTERNING A GATE STACK OF A NON-VOLATILE MEMORY (NVM) WITH FORMATION OF A CAPACITOR," naming Bradley P. Smith, and Mehul D. Shroff as inventors, and assigned to the current assignee hereof.

BACKGROUND

1. Field

This disclosure relates generally to non-volatile memories (NVMs), and more specifically, to patterning gate stacks of the NVMs.

2. Related Art

Gate stacks of NVM bit cells often include two layers of conductive material and either one of those conductive layers is also used for forming logic circuits or other circuits. Typically, both layers of conductive material are etched using a same mask to form the gate stack. During the etch of the two conductive materials of the NVM gate stack, end point detection is important in order to prevent over etching. Such an over etch may reduce the reliability and/or increase variability of the NVM array.

Figure 1:
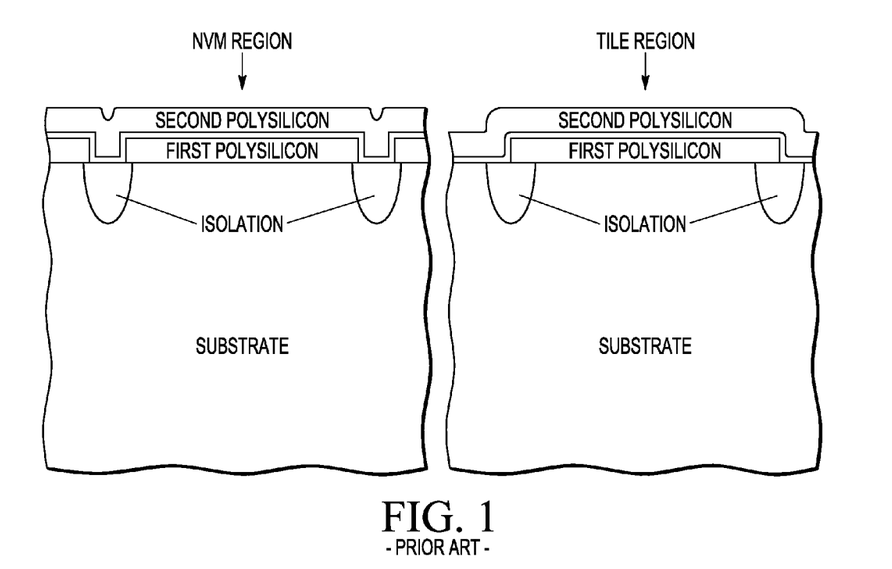
FIG. 1 illustrates a cross-sectional view of an integrated circuit having an NVM region and a tile region at a stage in processing, in accordance with the prior art.
Figure 2:
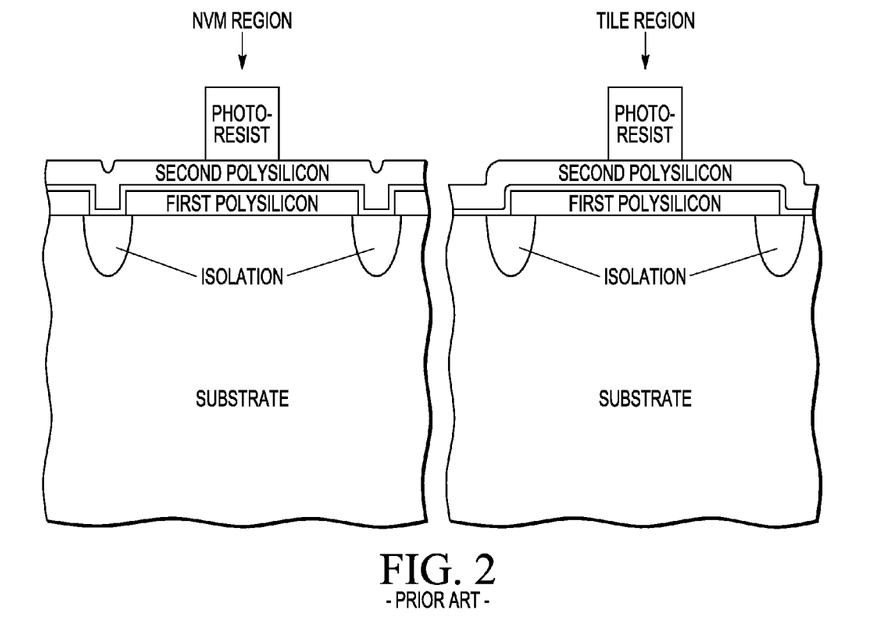
FIG. 2 illustrates a cross-section view of the integrated circuit of FIG. 1 at a subsequent stage in processing, in accordance with the prior art.
Figure 3:
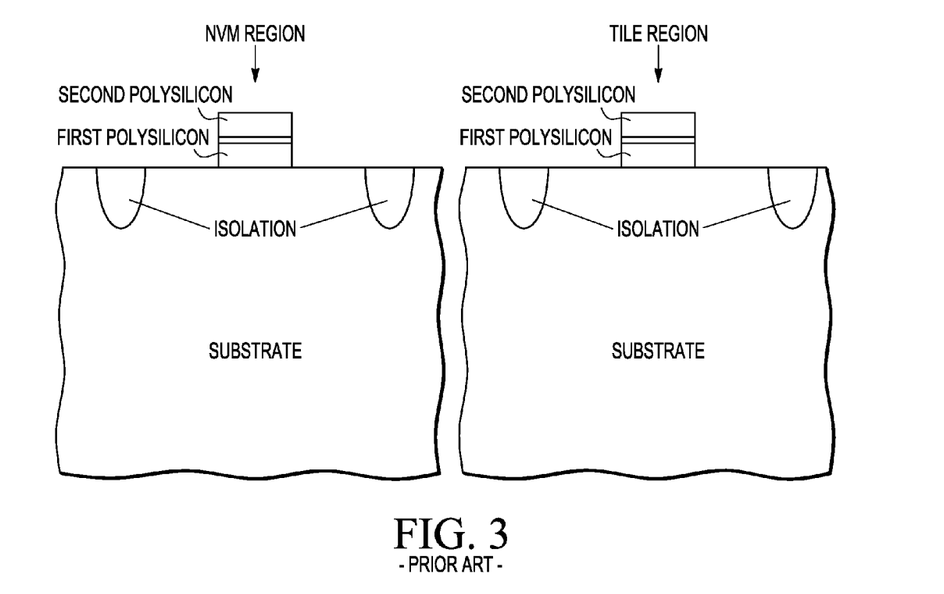
FIG. 3 illustrates a cross-section view of the integrated circuit of FIG. 2 at a subsequent stage in processing, in accordance with the prior art.

FIGS. 1-3 illustrate cross-sectional views of various stages during the formation of an integrated circuit having an NVM region and a tile region, in accordance with the prior art. Referring to FIG. 1, a first polysilicon layer is formed over the substrate in both the NVM region and the tile region. The first polysilicon layer is patterned such that a portion remains between the isolation regions in each of the NVM and tile regions. Subsequently, a dielectric layer is formed over the first polysilicon layer in both the NVM and tile regions, and a second polysilicon layer is formed over the dielectric layer in both the NVM and tile regions. In FIG. 2, a photoresist layer is formed over the second polysilicon layer and patterned, wherein the remaining portions of the photoresist layer correspond to a gate stack in the NVM region and a tile feature (also referred to as a dummy feature or fill feature) in the tile region. Each of the first polysilicon layer, dielectric layer, and the second dielectric layer is simultaneously etched, using the patterned photoresist layer, in the NVM region and the tile region. Therefore, referring to FIG. 3, the simultaneous etching in the NVM region and the tile region result in the formation of a gate stack in the NVM region having a portion of the first polysilicon layer and the second polysilicon layer and a tile feature in the tile region having both a portion of the first polysilicon layer and the second polysilicon layer. The tile feature in the tile region is formed over the substrate, between the isolation regions and not on the isolation regions. The simultaneous etching of the tile feature in the tile region at the same time as the gate stack in the NVM region provides additional material for use in end point detection during the gate stack etch. Note that the resulting tile feature is not electrically active.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a metal-oxide-semiconductor field effect transistor (MOSFET) is formed in a MOSFET region of an integrated circuit during formation of an NVM gate stack in an NVM region of the integrated circuit. During formation of the MOSFET gate stack, prior to the etch of the MOSFET gate stack, the MOSFET gate stack includes the same layers of material as the NVM gate stack so as to simulate the NVM gate stack. During an etch of the NVM gate stack, the MOSFET gate stack is also etched so that the etches of both the NVM and MOSFET gate stacks occur and end at the same time. This may allow for improved end point detection of the NVM gate stack etch due to increased volume of the material being etched.

Figure 4:
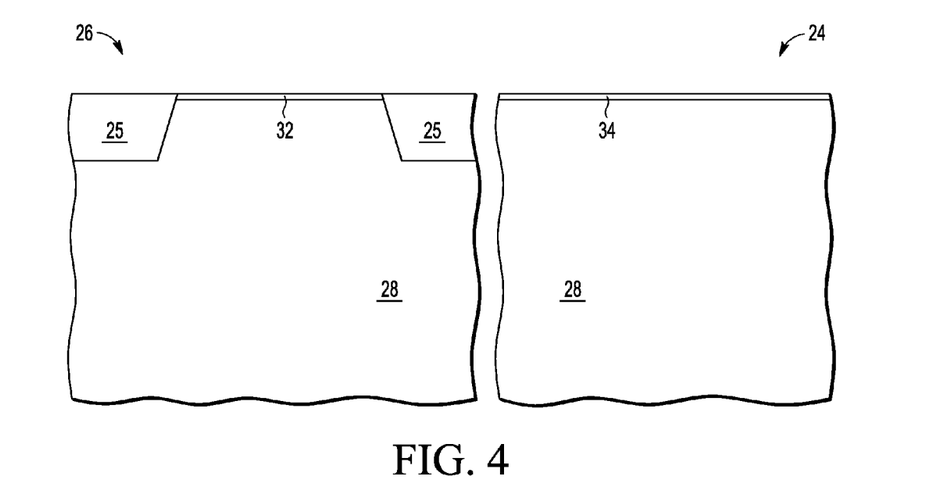
FIG. 4 illustrates a cross-sectional view of an integrated circuit having an NVM region and a MOSFET region at a stage in processing, in accordance with an embodiment of the present invention.

Shown in FIG. 4 is a cross-sectional view of an integrated circuit having a MOSFET region (the left portion) and an NVM region (the right portion). FIG. 4 illustrates MOSFET 26 (in the left portion) and NVM gate stack 24 (in the right portion) at an early stage in processing. Included in FIG. 4 is a substrate 28 and a gate dielectric 32 over substrate 28 in the MOSFET region and a gate dielectric 34 over substrate 28 in the NVM region. Substrate 28 also includes an isolation region 25, which may be a shallow trench isolation (STI) region, surrounding an active region for MOSFET 26. Substrate 28 can be any semiconductor material or combinations of materials, such as gallium arsenide, silicon germanium, silicon-on-insulator (SOI), silicon, monocrystalline silicon, the like, and combinations of the above.

Figure 5:
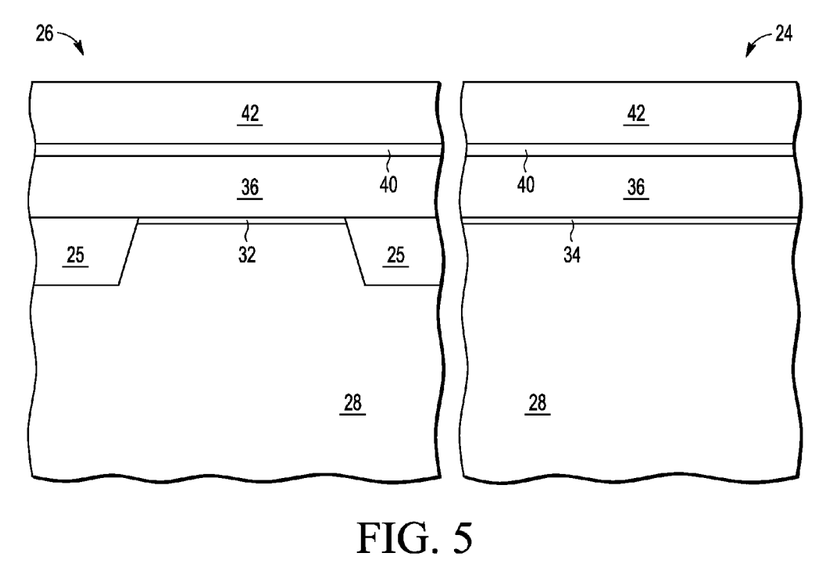
FIG. 5 illustrates a cross-sectional view of the NVM region and the MOSFET region of FIG. 4 at a subsequent stage in processing, in accordance with an embodiment of the present invention.

Shown in FIG. 5 are MOSFET 26 and NVM gate stack 24 in cross section form after depositing a conductive layer 36 over gate dielectric 32 in the MOSFET region and over gate dielectric 34 the NVM region. In one embodiment, conductive layer 36 is polysilicon and may be formed by a polysilicon deposition. A dielectric layer 40 is formed over conductive layer 36 in both the MOSFET region and the NVM region. In one embodiment, dielectric layer 40 may be formed by sequentially depositing oxide, then nitride, and then oxide. This type of layer may be referenced as an ONO layer. Other dielectrics or combinations of dielectrics may also be used for dielectric layer 40. A conductive layer 42 is formed over dielectric layer 40 in both the MOSFET region and the NVM region. Conductive layer 42 may be polysilicon and may be formed by a polysilicon deposition. In one embodiment, conductive layer 36 may be patterned (which would not be visible in the cross section of FIG. 5) prior to forming conductive layer 42. For the case of conductive layers 36 and 42 being polysilicon, layer 36 may be referred to as first poly and layer 42 as second poly.

Also, still referring to FIG. 5, after formation of conductive layer 42, a patterned etch may be performed to remove at least a portion of conductive layer 42 and dielectric layer 40 in the MOSFET region to expose an extension portion of conductive layer 36 in the MOSFET region. The removed portion may be located behind the page (behind the cross-sectional view of FIG. 5), and will be seen in reference to the 3-dimensional view of FIG. 10 below.

Figure 6:
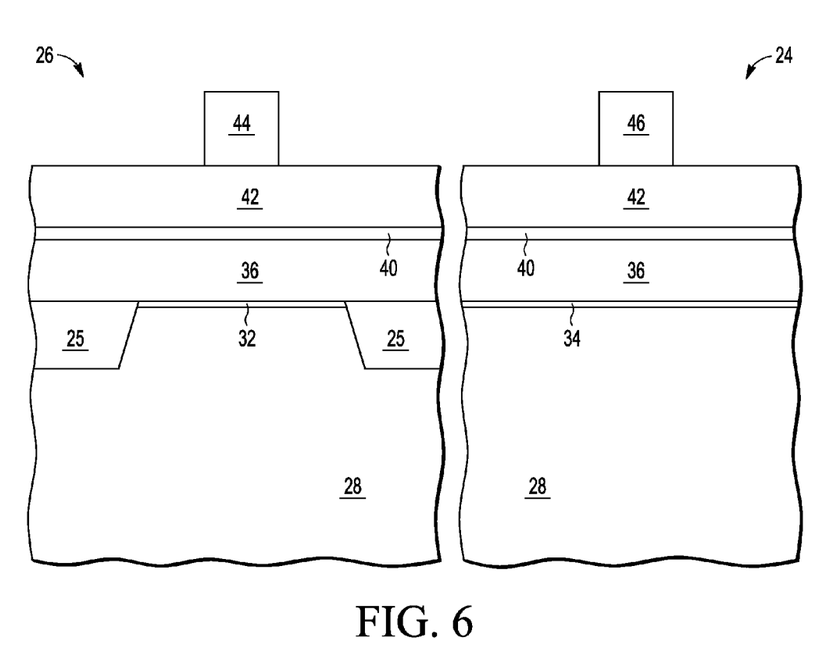
FIG. 6 illustrates a cross-sectional view of the NVM region and the MOSFET region of FIG. 5 at a subsequent stage in processing, in accordance with an embodiment of the present invention.
Figure 10:
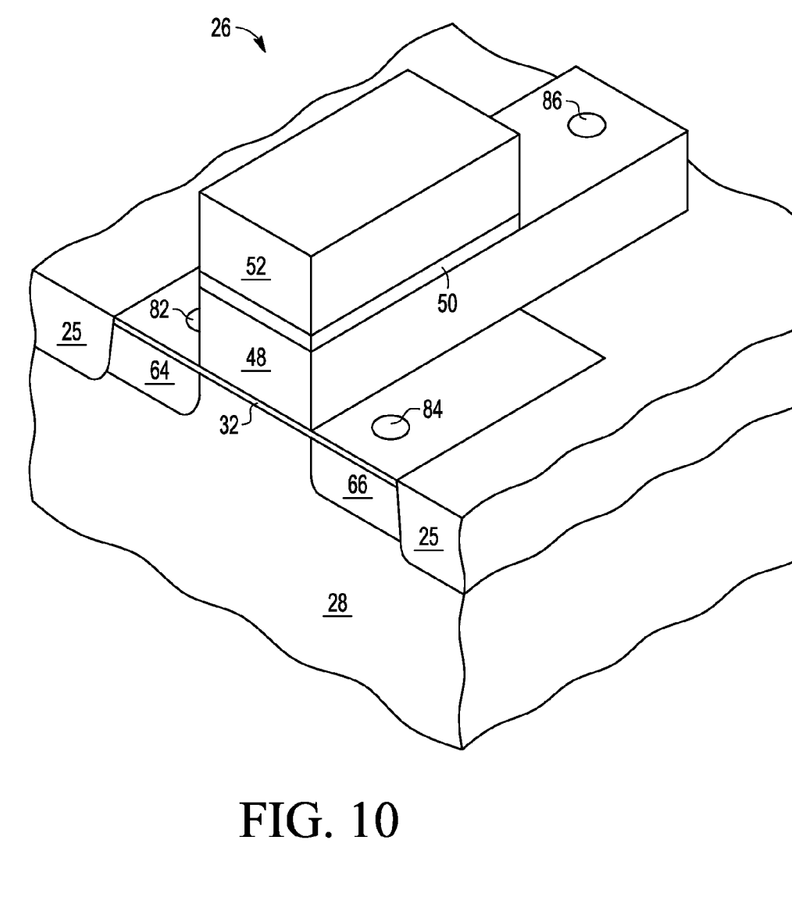
FIG. 10 illustrates a simplified three-dimensional view of the MOSFET region of FIG. 9, in accordance with an embodiment of the present invention.

Shown in FIG. 6 are MOSFET 26 and NVM gate stack 24 after forming patterned photoresist portion 44 in the MOSFET region where MOSFET 26 is formed and patterned photoresist portion 46 in the NVM region where NVM gate stack 24 is formed. Patterned photoresist portion 44 defines the MOSFET gate stack of MOSFET 26 and patterned photoresist portion 46 defines NVM gate stack 24 of an NVM bit cell. In one embodiment, due to the patterned etch used to expose an extension portion of conductive layer 36 in the MOSFET region, patterned photoresist portion 44 defines the MOSFET gate stack and an extension in the extension portion extending from the gate stack, which is illustrated in FIG. 10.

Figure 7:
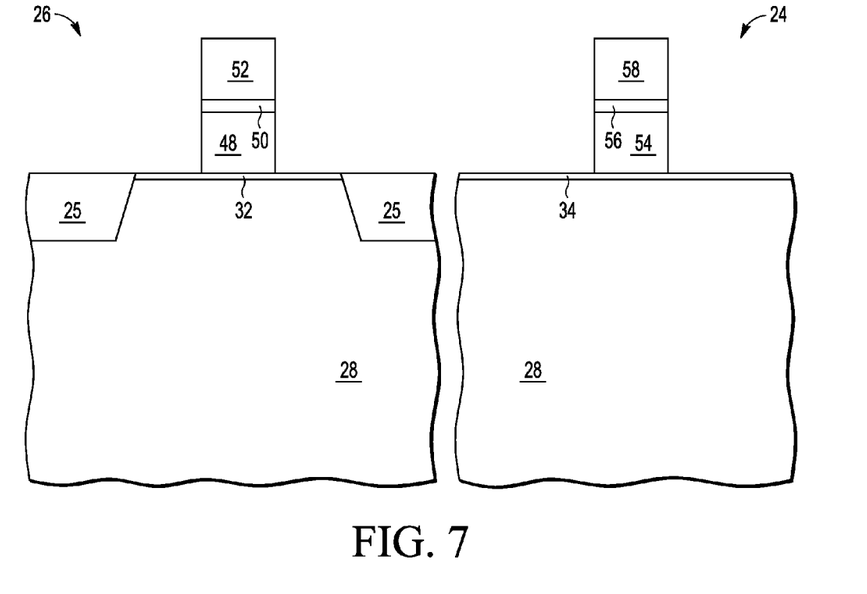
FIG. 7 illustrates a cross-sectional view of the NVM region and the MOSFET region of FIG. 6 at a subsequent stage in processing, in accordance with an embodiment of the present invention.

Shown in FIG. 7 are MOSFET 26 and NVM gate stack 24 after etching through conductive layer 42, dielectric layer 40, and conductive layer 36 using patterned photoresist portions 44 and 46. This etch results in the MOSFET gate stack of MOSFET 26 having a first conductive layer 48 (formed from conductive layer 36), a dielectric 50 (formed from dielectric layer 40) over first conductive layer 48, and a second conductive layer 52 (formed from conductive layer 42) over dielectric 50. The MOSFET gate stack is located over the active region of substrate 28 that is surrounded by isolation region 25. This etch also results in NVM gate stack 24 having a first conductive layer 54 (formed from conductive layer 36), a dielectric 56 (formed from dielectric layer 40) over dielectric 56, and a second conductive layer 58 (formed from conductive layer 42) over dielectric 56. During this etch, conductive layers 58 and 54 are patterned to desirably have nearly vertical sidewalls using an anisotropic etch. This etch is ended by detecting that the etch has reached gate dielectric 34 in the NVM region of NVM gate stack 24. A change in the material composition in the etch chamber is detected when the etch is no longer vertically etching polysilicon and is slowly etching gate dielectric 34, which may be grown oxide (which may also be called thermal oxide). Therefore, conductive layer 36 in the MOSFET region provides additional material for detection that the end point of the NVM gate stack etch has been reached.

In an alternate embodiment, the patterned etch described above in reference to FIG. 5 to expose the extension portion of conductive layer 36 is not performed such that, after the etch through conductive layer 42, dielectric layer 40, and conductive layer 36 using photoresist portion 44, a portion of conductive layer 48 is not yet exposed. In this alternate embodiment, after this etch using photoresist portion 44, a patterned etch may be preformed to expose a portion of underlying conductive layer 48 so that contact can be made to conductive layer 48.

Figure 8:
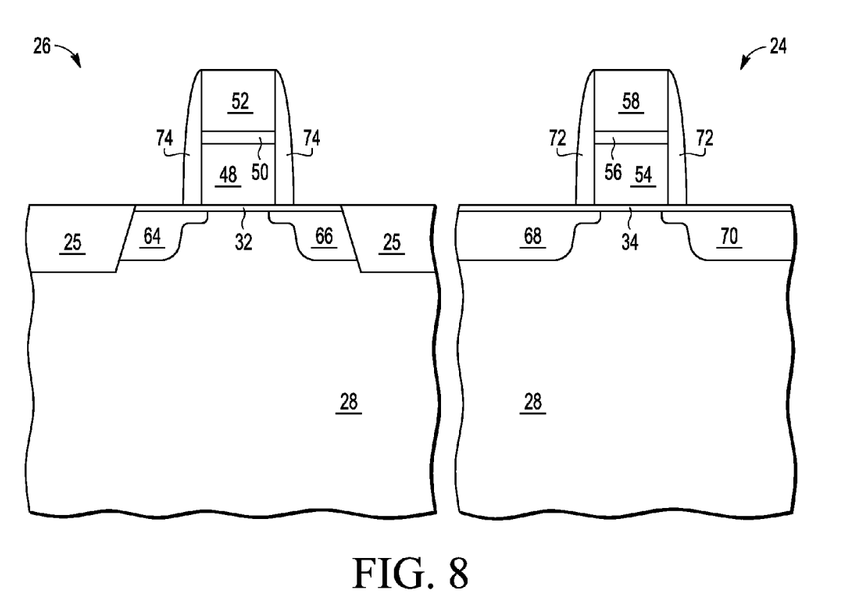
FIG. 8 illustrates a cross-sectional view of the NVM region and the MOSFET region of FIG. 7 at a subsequent stage in processing, in accordance with an embodiment of the present invention.

Shown in FIG. 8, are MOSFET 26 and NVM gate stack 24 after forming a sidewall spacer 74 along sidewalls of the MOSFET gate stack of MOSFET 26 and a sidewall spacer 72 along sidewalls of NVM gate stack 24. Also, source/drain regions 64 and 66 are formed within substrate 28 laterally adjacent the MOSFET gate stack. Source/drain regions 64 and 66 are formed within the active region defined by isolation regions 25. Also, source/drain regions 68 and 70 are formed laterally adjacent NVM gate stack 24 to form an NVM array bit cell 62. In one embodiment, source/drain regions 64, 66, 68, and 70 are formed by performing one or more implants using NVM gate stack 24 as a mask to provide source/drain regions 68 and 70 and using the remaining portion of conductive layer 52 and conductive layer 48 to provide source/drain regions 64 and 66. Note that sidewall spacers 74 and 72 may also be used as a mask during the implant. In one embodiment, after performing the implant, exposed portions of dielectric 32 and 34 adjacent stacks 26 and 24 maybe removed. Also, first poly may be referred to as a floating gate of the NVM bit cell and the second poly may be referred to as the control gate of the NVM.

Figure 9:
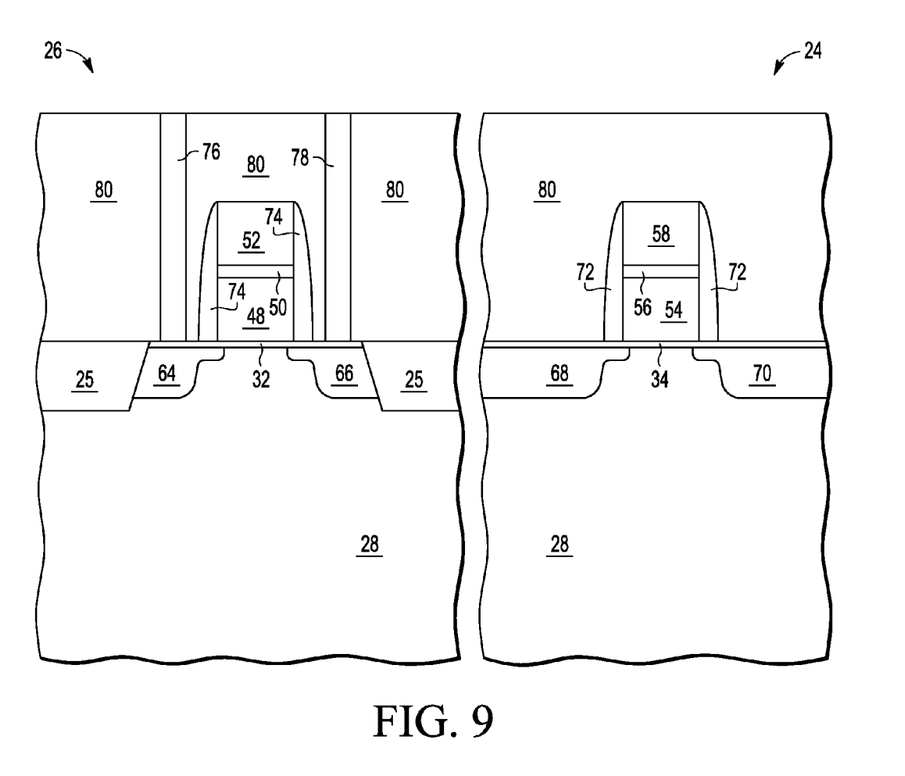
FIG. 9 illustrates a cross-sectional view of the NVM region and the MOSFET region of FIG. 8 at a subsequent stage in processing, in accordance with an embodiment of the present invention.

Shown in FIG. 9, are MOSFET 26 and NVM gate stack 24 after forming dielectric layer 80 and contacts 76 and 78 to source/drain regions 64 and 66, respectively. Also, as will be described in reference to FIG. 10, a contact (not shown in the cross section of FIG. 9) is formed to the gate (conductive layer 48) of MOSFET 26.

Shown in FIG. 10 is a three-dimensional view of MOSFET 26. For ease of illustration, contacts 76 and 78 are not shown (instead, their location is indicated by contact locations 82 and 84, respectively) and sidewall spacer 74 is not shown. As described above, a portion of conductive layer 52 and dielectric 50 were removed to expose a portion of underlying conductive layer 48; therefore, a contact can be formed on the exposed portion of underlying conductive layer 48, as indicated by contact location 86, in order to make contact to the gate of MOSFET 26 (conductive layer 48). Therefore, although the MOSFET gate stack included the same layers as NVM gate stack 24, the top portions of the gate stack (e.g. dielectric 50 and conductive layer 52) are not used in the operation of MOSFET 26. Also, in one embodiment, after etching the MOSFET gate stack simultaneous with the etch of NVM gate stack 24, all of dielectric 50 and conductive layer 52 may be removed from over conductive layer 48. In yet another embodiment, portions of conductive layer 52 and dielectric 50 are not removed to expose underlying conductive layer 48. In this embodiment, conductive layer 52 may be contacted and connected to underlying conductive layer 48 or to some other circuit node.

Therefore, note that the MOSFET gate stack of MOSFET 26 included dielectric layer 50 and second conductive layer 52 over first conductive layer 48 at the time the NVM stack etch is performed. In this manner, the MOSFET gate stack of MOSFET 26 simulates the gate stack used for the NVM array in the NVM region. Therefore, the MOSFET gate stack (which include the same stack of materials as NVM gate stack 24) can be simultaneously etched with the etch of NVM gate stack 24 to allow for improved end point detection.

By now it should be appreciated that there has been provided a method for improved end point detection during the etch of the NVM gate stack etch by simultaneously etching the gate stack of a MOSFET whose stack of materials at the time of the NVM gate stack etch mimics the stack of materials present in the NVM gate stack.

Although the invention is described herein with reference to specific embodiments, various modifications and changes can be made without departing from the scope of the present invention as set forth in the claims below. For example, different materials may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of making a MOSFET in a transistor region of a substrate and a non-volatile memory cell in an NVM region of the substrate, and the method includes forming a first dielectric layer on the substrate in the transistor region and the NVM region; forming a first conductive layer on the first dielectric layer; forming a second dielectric layer on the first conductive layer; forming a second conductive layer over the second dielectric layer; performing a patterned etch to remove at least a portion of the second conductive layer in the transistor region and to expose an extension portion of the first conductive layer in the transistor region; forming a first mask over the transistor region having a first pattern, wherein the first pattern is of a gate stack of the MOSFET and an extension in the extension portion extending from the gate stack, and a second mask over the NVM region having a second pattern, wherein the second pattern is of a gate stack of the non-volatile memory cell; performing a patterned etch through the second conductive layer, the second dielectric layer, and the first conductive layer to leave the first pattern of the gate stack of the MOSFET in the transistor region and the second pattern of the gate stack in the NVM region; and implanting using the gate stack in the NVM region as a mask to provide source/drain regions adjacent to the gate stack in the NVM region and using a remaining portion of the second conductive layer and the first conductive layer of the gate stack in the MOSFET region to provide source/drain regions in the MOSFET region adjacent to the first conductive layer of the gate stack of the MOSFET. Item 2 includes the method of item 1, and further includes forming an isolation region in the substrate to define an active region, wherein the step of performing an implant is further characterized as forming the source/drain regions of the MOSFET in the active region. Item 3 includes the method of item 2, wherein the step of performing a patterned etch to remove at least a portion is further characterized by the portion being over the isolation region. Item 4 includes the method of item 1, wherein the gate stack in the NVM region comprises a control gate as a portion of the second conductive layer and a floating gate as a portion of the first conductive layer. Item 5 includes the method of item 1, and further includes forming sidewall spacers adjacent to the gate stacks in the NVM and MOSFET regions. Item 6 includes the method of item 5, wherein the step of performing the implant is further characterized by the sidewall spacers acting as a mask. Item 7 includes the method of item 1, and further includes removing the first dielectric layer adjacent to the gate stacks after the step of performing the implant. Item 8 includes the method of item 1, and further includes performing a patterned etch of the first conductive layer prior to the step of forming the second conductive layer in the NVM region. Item 9 includes the method of item 1, and further includes forming an interlayer dielectric over the gate stacks and the source/drain regions. Item 10 includes the method of item 9, and further includes forming contacts through the interlayer dielectric to the source/drain regions.

Item 11 includes a method of making a MOSFET in a transistor region of a substrate and a non-volatile memory cell in an NVM region of the substrate, and the method includes forming a first dielectric layer on the substrate in the transistor region and the NVM region; forming a first conductive layer on the first dielectric layer; forming a second dielectric layer on the first conductive layer; forming a second conductive layer over the second dielectric layer; forming a first mask over the transistor region having a first pattern, wherein the first pattern is of a gate stack of the MOSFET, and a second mask over the NVM region having a second pattern, wherein the second pattern is of a gate stack of the non-volatile memory cell; performing a patterned etch through the second conductive layer, the second dielectric layer, and the first conductive layer to leave the first pattern of the gate stack of the MOSFET in the transistor region and the second pattern of the gate stack in the NVM region; forming sidewall spacers adjacent to the gate stack in the NVM region and to the gate stack in the MOSFET regions; performing a patterned etch to remove at least a portion of the second conductive layer of the gate stack of the MOSFET to expose a portion of the first conductive layer of the gate stack of the MOSFET; and implanting using the gate stack and sidewall spacers in the NVM region as a mask to provide source/drain regions adjacent to the gate stack in the NVM region and using a remaining portion of the second conductive layer, the first conductive layer of the gate stack, and the sidewall spacers in the MOSFET region to provide source/drain regions in the MOSFET region adjacent to the first conductive layer of the gate stack of the MOSFET. Item 12 includes the method of item 12, and further includes forming an isolation region in the substrate to define an active region, wherein the step of performing an implant is further characterized as forming the source/drain regions of the MOSFET in the active region. Item 13 includes the method of item 12, wherein the step of performing a patterned etch to remove at least a portion is further characterized by the portion being over the isolation region. Item 14 includes the method of item 13, wherein the gate stack in the NVM region comprises a control gate as a portion of the second conductive layer and a floating gate as a portion of the first conductive layer. Item 15 includes the method of item 14, and further includes removing the first dielectric layer adjacent to the gate stacks after the step of performing the implant.

Item 16 includes a method of making a MOSFET in a transistor region of a substrate and a non-volatile memory cell in an NVM region of the substrate, and the method includes forming a first dielectric layer on the substrate in the transistor region and the NVM region; forming a first conductive layer on the first dielectric layer; forming a second dielectric layer on the polysilicon layer; forming a second conductive layer over the second dielectric layer; performing a step, including a first etch followed by a second etch, for etching the first conductive layer and the second conductive layer to result in an NVM gate stack in the NVM region and a transistor gate stack in the transistor region, wherein the transistor gate stack includes a portion of the second conductive layer and a first portion and a second portion of the first conductive layer, wherein the first portion is aligned with the portion of the second conductive layer and the second portion extends from the first portion away from being under the portion of the second conductive layer; and implanting using the NVM gate stack as a mask to provide source/drain regions adjacent to the gate stack in the NVM region and using the transistor gate stack in the transistor region to provide source/drain regions in the transistor region adjacent to the first portion of the first conductive layer of the transistor gate stack of the MOSFET. Item 17 includes the method of item 16, wherein the step of forming the first conductive layer comprises forming a first polysilicon layer. Item 18 includes the method of item 17, wherein the step of forming the second conductive layer comprises forming a second polysilicon layer. Item 19 includes the method of item 16, wherein the first etch comprises selectively etching the first conductive layer and the second conductive layer and the second etch comprises selectively etching the first conductive layer to expose the second portion of the second conductive layer. Item 20 includes the method of item 16, wherein the first etch comprises selectively etching the second conductive layer to include exposing at least the second portion of the first conductive layer.

What is claimed is:

1. A method of making a MOSFET in a transistor region of a substrate and a non-volatile memory cell in an NVM region of the substrate, comprising:
   forming a first dielectric layer on the substrate in the transistor region and the NVM region;
   forming a first conductive layer on the first dielectric layer;
   forming a second dielectric layer on the first conductive layer;
   forming a second conductive layer over the second dielectric layer;
   performing a patterned etch to remove at least a portion of the second conductive layer in the transistor region and to expose an extension portion of the first conductive layer in the transistor region;
   forming a first mask over the transistor region having a first pattern, wherein the first pattern is of a gate stack of the MOSFET and an extension in the extension portion extending from the gate stack, and a second mask over the NVM region having a second pattern, wherein the second pattern is of a gate stack of the non-volatile memory cell;
   performing a patterned etch through the second conductive layer, the second dielectric layer, and the first conductive layer to leave the first pattern of the gate stack of the MOSFET in the transistor region and the second pattern of the gate stack in the NVM region; and
   implanting using the gate stack in the NVM region as a mask to provide source/drain regions adjacent to the gate stack in the NVM region and using a remaining portion of the second conductive layer and the first conductive layer of the gate stack in the MOSFET region to provide source/drain regions in the MOSFET region adjacent to the first conductive layer of the gate stack of the MOSFET.

2. The method of claim 1, further comprising forming an isolation region in the substrate to define an active region, wherein the step of performing an implant is further characterized as forming the source/drain regions of the MOSFET in the active region.

3. The method of claim 2, wherein the step of performing a patterned etch to remove at least a portion is further characterized by the portion being over the isolation region.

4. The method of claim 1, wherein the gate stack in the NVM region comprises a control gate as a portion of the second conductive layer and a floating gate as a portion of the first conductive layer.

5. The method of claim 1, further comprising forming sidewall spacers adjacent to the gate stacks in the NVM and MOSFET regions.

6. The method of claim 5, wherein the step of performing the implant is further characterized by the sidewall spacers acting as a mask.

7. The method of claim 1, further comprising removing the first dielectric layer adjacent to the gate stacks after the step of performing the implant.

8. The method of claim 1, further comprising performing a patterned etch of the first conductive layer prior to the step of forming the second conductive layer in the NVM region.

9. The method of claim 1, further comprising forming an interlayer dielectric over the gate stacks and the source/drain regions.

10. The method of claim 9, further comprising forming contacts through the interlayer dielectric to the source/drain regions.

11. A method of making a MOSFET in a transistor region of a substrate and a non-volatile memory cell in an NVM region of the substrate, comprising:
   forming a first dielectric layer on the substrate in the transistor region and the NVM region;
   forming a first conductive layer on the first dielectric layer;
   forming a second dielectric layer on the first conductive layer;
   forming a second conductive layer over the second dielectric layer;
   forming a first mask over the transistor region having a first pattern, wherein the first pattern is of a gate stack of the MOSFET, and a second mask over the NVM region having a second pattern, wherein the second pattern is of a gate stack of the non-volatile memory cell;

performing a patterned etch through the second conductive layer, the second dielectric layer, and the first conductive layer to leave the first pattern of the gate stack of the MOSFET in the transistor region and the second pattern of the gate stack in the NVM region;

forming sidewall spacers adjacent to the gate stack in the NVM region and to the gate stack in the MOSFET regions;

performing a patterned etch to remove at least a portion of the second conductive layer of the gate stack of the MOSFET to expose a portion of the first conductive layer of the gate stack of the MOSFET; and implanting using the gate stack and sidewall spacers in the NVM region as a mask to provide source/drain regions adjacent to the gate stack in the NVM region and using a remaining portion of the second conductive layer, the first conductive layer of the gate stack, and the sidewall spacers in the MOSFET region to provide source/drain regions in the MOSFET region adjacent to the first conductive layer of the gate stack of the MOSFET.

12. The method of claim 11, further comprising forming an isolation region in the substrate to define an active region, wherein the step of performing an implant is further characterized as forming the source/drain regions of the MOSFET in the active region.

13. The method of claim 12, wherein the step of performing a patterned etch to remove at least a portion is further characterized by the portion being over the isolation region.

14. The method of claim 13, wherein the gate stack in the NVM region comprises a control gate as a portion of the second conductive layer and a floating gate as a portion of the first conductive layer.

15. The method of claim 14, further comprising removing the first dielectric layer adjacent to the gate stacks after the step of performing the implant.

16. A method of making a MOSFET in a transistor region of a substrate and a non-volatile memory cell in an NVM region of the substrate, comprising:

forming a first dielectric layer on the substrate in the transistor region and the NVM region;

forming a first conductive layer on the first dielectric layer;

forming a second dielectric layer on the polysilicon layer;

forming a second conductive layer over the second dielectric layer;

performing a step, including a first etch followed by a second etch, for etching the first conductive layer and the second conductive layer to result in an NVM gate stack in the NVM region and a transistor gate stack in the transistor region, wherein the transistor gate stack includes a portion of the second conductive layer and a first portion and a second portion of the first conductive layer, wherein the first portion is aligned with the portion of the second conductive layer and the second portion extends from the first portion away from being under the portion of the second conductive layer; and implanting using the NVM gate stack as a mask to provide source/drain regions adjacent to the gate stack in the NVM region and using the transistor gate stack in the transistor region to provide source/drain regions in the transistor region adjacent to the first portion of the first conductive layer of the transistor gate stack of the MOSFET.

17. The method of claim 16, wherein the step of forming the first conductive layer comprises forming a first polysilicon layer.

18. The method of claim 17, wherein the step of forming the second conductive layer comprises forming a second polysilicon layer.

19. The method of claim 16, wherein the first etch comprises selectively etching the first conductive layer and the second conductive layer and the second etch comprises selectively etching the first conductive layer to expose the second portion of the second conductive layer.

20. The method of claim 16, wherein the first etch comprises selectively etching the second conductive layer to include exposing at least the second portion of the first conductive layer.

\* \* \* \* \*